US012571085B2

(12) United States Patent
Nie et al.

(10) Patent No.: US 12,571,085 B2
(45) Date of Patent: Mar. 10, 2026

(54) NOBLE METAL-TRANSITION METAL-BASED NANO-CATALYST THIN FILM AND PREPARATION METHOD THEREOF

(71) Applicants:CHONGQING UNIVERSITY, Chongqing (CN); CHINA UNIVERSITY OF MINING AND TECHNOLOGY, BEIJING, Beijing (CN)

(72) Inventors: Baisheng Nie, Chongqing (CN); Fanbei Kong, Chongqing (CN); Xianfeng Liu, Chongqing (CN); Xiangchun Li, Chongqing (CN); Junqing Meng, Chongqing (CN); Tao Zhu, Chongqing (CN)

(73) Assignees: CHONGQING UNIVERSITY, Chongqing (CN); CHINA UNIVERSITY OF MINING AND TECHNOLOGY, BEIJING, Beijing (CN)

( * ) Notice: Subject to any disclaimer, the term of this patent is extended or adjusted under 35 U.S.C. 154(b) by 435 days.

(21) Appl. No.: 18/147,140

(22) Filed: Dec. 28, 2022

(65) Prior Publication Data

US 2023/0285953 A1      Sep. 14, 2023

(30) Foreign Application Priority Data

Dec. 31, 2021    (CN) .......................... 202111670267.8

(51) Int. Cl.
C23C 14/04 (2006.01)
B01J 21/06 (2006.01)
(Continued)

(52) U.S. Cl.
CPC ........... C23C 14/046 (2013.01); B01J 21/063 (2013.01); B01J 23/89 (2013.01); B01J 35/45 (2024.01);
(Continued)

(58) Field of Classification Search
CPC ..... C23C 14/046; C23C 14/021; C23C 14/08; C23C 14/081; C23C 14/14; B01J 37/341;
(Continued)

(56) References Cited

U.S. PATENT DOCUMENTS 8,925,534 B2 * 1/2015 Bachmann ............. B82Y 30/00
123/668
10,487,394 B2 * 11/2019 Widrig .................. C23C 14/564

FOREIGN PATENT DOCUMENTS

CN          113755925 A  * 12/2021

OTHER PUBLICATIONS

Huang, X.; Liu, C.; Lv, X.; Liu, G.; Li, F. "Aluminum alloy pistons reinforced with SiC fabricated by centrifugal casting". Journal of Materials Processing Technology 211. p. 1540-1546. (Year: 2011).*
(Continued)

*Primary Examiner* — Michael A Band
(74) *Attorney, Agent, or Firm* — Dickinson Wright PLLC

(57)          ABSTRACT

The present disclosure provides a noble metal-transition metal-based nano-catalyst thin film and a preparation method thereof, belonging to the fields of energy development and pollutant emission reduction. Based on a micro-nano processing technology, a noble metal-transition metal-based nano-catalyst thin film is loaded on a semi-cylindrical pipe with an inner thread structure, and heat generated is quickly accumulated on an upper surface of the catalyst to establish a large temperature gradient. By the insulation and high roughness of an alumina carrier layer and the inner thread structure of the pipe, a catalyst loading area is (Continued)

maximized and dispersion of noble metal atoms is enhanced. A transition metal-transition metal oxide thin film protects a noble metal nano-catalyst by core-shell wrapping, and a transition metal oxide prevents catalyst deactivation caused by oxygen occupying too many metal active sites.

7 Claims, 2 Drawing Sheets

(51) Int. Cl.

| | | |
|---|---|---|
| *B01J 23/89* | (2006.01) | |
| *B01J 35/45* | (2024.01) | |
| *B01J 37/02* | (2006.01) | |
| *B01J 37/34* | (2006.01) | |
| *C23C 14/02* | (2006.01) | |
| *C23C 14/08* | (2006.01) | |
| *C23C 14/14* | (2006.01) | |

(52) U.S. Cl.
CPC ......... *B01J 37/0217* (2013.01); *B01J 37/341* (2013.01); *C23C 14/021* (2013.01); *C23C 14/08* (2013.01); *C23C 14/081* (2013.01); *C23C 14/14* (2013.01)

(58) Field of Classification Search
CPC ...... B01J 37/0217; B01J 21/063; B01J 23/89; B01J 35/45
See application file for complete search history.

(56) References Cited

OTHER PUBLICATIONS

Machine Translation CN 113755925 (Year: 2021).*

\* cited by examiner

NOBLE METAL-TRANSITION METAL-BASED NANO-CATALYST THIN FILM AND PREPARATION METHOD THEREOF

CROSS REFERENCE TO RELATED APPLICATION

This patent application claims the benefit and priority of Chinese Patent Application No. 202111670267.8, filed with the China National Intellectual Property Administration on Dec. 31, 2021, the disclosure of which is incorporated by reference herein in its entirety as part of the present application.

TECHNICAL FIELD

The present disclosure relates to the technical field of energy development and pollutant emission reduction, in particular to a noble metal-transition metal-based nano-catalyst thin film and a preparation method thereof.

BACKGROUND

There are abundant gas (coal bed methane) resources in the world. However, a large amount of extremely low-concentration gas (containing $CH_4$ of not more than 1 vol %) cannot be treated by conventional combustion methods due to a concentration lower than a lower limit of lean combustion, which is difficult to use with an extremely poor utilization ratio. At present, mines discharge such gas directly into the atmosphere as a main treatment method, causing serious waste of resources and environmental pollution.

Catalytic combustion is a treatment method that can efficiently recover and utilize the extremely low-concentration gas. The catalytic combustion can realize oxidation of the extremely low-concentration gas at a lower temperature, while reducing the emission of pollutant gases such as $NO_x$ and CO during the treatment. Noble metals such as palladium and platinum have a desirable catalytic effect on the oxidation of hydrocarbons and their derivatives, and have a long service life and are easy to recycle. Such noble metals have an interaction with oxide carriers to further enhance the catalytic activity, and are currently widely used in the research on catalytic combustion of the extremely low-concentration gas. However, noble metals have limited reserves, high cost, and easy deactivation due to sintering at high temperatures. Therefore, it is extremely important to appropriately reduce the content of noble metals in the catalyst and improve the utilization efficiency and stability of metal active centers in the design of catalytic combustion experiments.

The currently-studied noble metal catalysts are generally prepared by chemical methods, including impregnation, reduction deposition, and supramolecular self-assembly, and have a low catalytic activity.

SUMMARY

In view of this, an objective of the present disclosure is to provide a noble metal-transition metal-based nano-catalyst thin film and a preparation method thereof. The noble metal-transition metal-based nano-catalyst thin film has a high catalytic activity and can be used for catalytic combustion of extremely low-concentration gas.

To achieve the above objective, the present disclosure provides the following technical solutions.

The preparation method provides a preparation method of a noble metal-transition metal-based nano-catalyst thin film, including the following steps:

providing a semi-cylindrical pipe with an inner thread structure;

conducting a surface pretreatment on the semi-cylindrical pipe to obtain a pretreated substrate; and conducting magnetron sputtering on a surface of the pretreated substrate to sequentially obtain an alumina carrier layer, a noble metal-based elementary substance layer, and a transition metal-transition metal oxide layer, thereby obtaining the noble metal-transition metal-based nano-catalyst thin film.

Preferably, the semi-cylindrical pipe is prepared from silicon carbide.

Preferably, the semi-cylindrical pipe has a length of 20 mm, an inner diameter of 20 mm, a number of threads of 30, a wall thickness of 1 mm, a thread rib width of 0.7 mm, a thread rib height of 0.7 mm, a helix angle of 30°, and a thread pitch of 2 mm.

Preferably, the surface pretreatment is to conduct ultrasonic washing with acetone, ultrasonic washing with water, water rinsing, blow-drying, soaking in an oxalic acid solution, and drying in sequence.

Preferably, the magnetron sputtering is conducted at a background vacuum degree of less than $2 \times 10^{-6}$ Torr.

Preferably, the preparation method further includes splicing two of the semi-cylindrical pipes after magnetron sputtering into a cylindrical pipe after the transition metal-transition metal oxide layer is obtained.

Preferably, the noble metal is selected from the group consisting of palladium and platinum; and the transition metal is selected from the group consisting of cobalt, titanium, copper, iron, and nickel.

The preparation method further provides a noble metal-transition metal-based nano-catalyst thin film prepared by the preparation method, including the semi-cylindrical pipe, the alumina carrier layer, the noble metal-based elementary substance layer, and the transition metal-transition metal oxide layer.

Preferably, the alumina carrier layer has a thickness of 20 μm, and the noble metal-based elementary substance layer and the transition metal-transition metal oxide layer have a total thickness of less than or equal to 100 μm.

The preparation method provides a preparation method of a noble metal-transition metal-based nano-catalyst thin film, including the following steps: providing a semi-cylindrical pipe with an inner thread structure; conducting a surface pretreatment on the semi-cylindrical pipe to obtain a pretreated substrate; and conducting magnetron sputtering on a surface of the pretreated substrate to sequentially obtain an alumina carrier layer, a noble metal-based elementary substance layer, and a transition metal-transition metal oxide layer, thereby obtaining the noble metal-transition metal-based nano-catalyst thin film. In the present disclosure, based on a micro-nano processing technology, a noble metal-transition metal-based nano-catalyst thin film is loaded on a semi-cylindrical pipe with an inner thread structure, and heat generated is quickly accumulated on an upper surface of the catalyst to establish a large temperature gradient. By the insulation and high roughness of an alumina carrier layer and the inner thread structure of the pipe, a catalyst loading area is maximized, dispersion of noble metal atoms is enhanced, and a high-temperature stability of the noble metal nano-catalysts is improved. A layer of transition metal-transition metal oxide film is further sup-
ported on the noble metal nano-catalyst thin film, which
protects the noble metal nano-catalyst inside by core-shell
wrapping; and chemical properties of the transition metal
oxide itself can adjust the change of an oxygen content in the
pipe through the change of a valence state, which prevents
catalyst deactivation caused by oxygen occupying too many
metal active sites. Meanwhile, a gas flow generates axial
circulation in the pipe under the influence of the inner thread
structure, thereby reducing a temperature difference between
upper and lower walls, which is conducive to uniform heat
transfer in the pipe. The noble metal-transition metal-based
nano-catalyst thin film can realize catalytic combustion of
extremely low-concentration gas under low temperature
conditions, so as to reduce environmental problems caused
by direct emission of the extremely low-concentration gas,
while improving economic benefits of gas utilization.

Moreover, the preparation method has simple steps, with
raw materials fully utilized.

DETAILED DESCRIPTION OF THE EMBODIMENTS

Figures 1, 2:
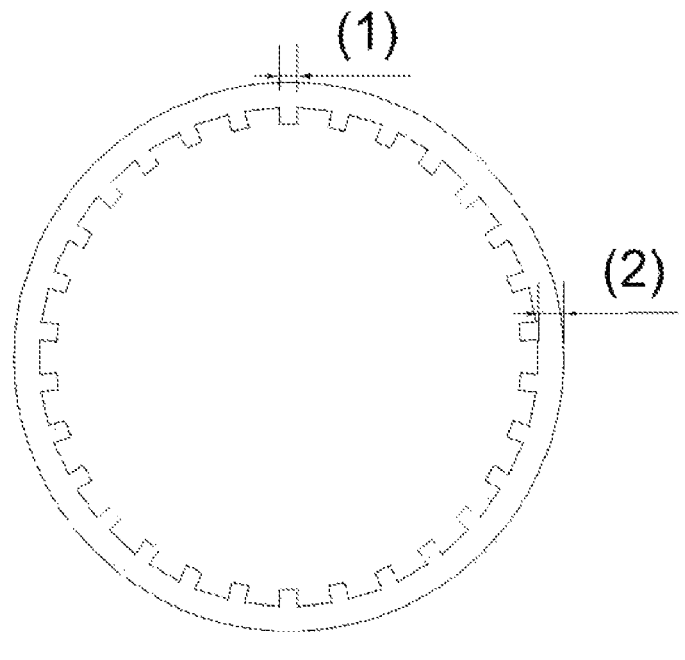
FIG. 1 shows a front sectional view of a cylindrical pipe
with an inner thread structure.
FIG. 2 shows a side sectional view of the semi-cylindrical
pipe with an inner thread structure.

The preparation method provides a preparation method a
noble metal-transition metal-based nano-catalyst thin film,
including the following steps:

providing a semi-cylindrical pipe with an inner thread
    structure;
  conducting a surface pretreatment on the semi-cylindrical
    pipe to obtain a pretreated substrate; and
  conducting magnetron sputtering on a surface of the
    pretreated substrate to sequentially obtain an alumina
    carrier layer, a noble metal-based elementary substance
    layer, and a transition metal-transition metal oxide
    layer, thereby obtaining the noble metal-transition
    metal-based nano-catalyst thin film.

In the present disclosure, a semi-cylindrical pipe is pro-
vided. The semi-cylindrical pipe has a thread structure, and
the pipe with the thread structure has a ribbed structure that
can cause axial circulation, thereby inhibiting a buoyancy
force in the pipe. Therefore, low-density fluid no longer
accumulates at a top of the pipe (fluid accumulation at the
top may cause excessive heating on an upper wall to affect
the activity of the catalyst), and may have a better heat
transfer effect than that of smooth pipes, while the heat
transfer effect in the pipe is conducive to the catalytic
oxidation.

In the present disclosure, the semi-cylindrical pipe is
preferably prepared from silicon carbide, showing a desir-
able heat transfer performance.

In the present disclosure, the semi-cylindrical pipe has a
length of preferably 20 mm, an inner diameter of preferably
20 mm, a number of threads of preferably 30, a wall thickness of preferably 1 mm, a thread rib width of prefer-
ably 0.7 mm, a thread rib height of preferably 0.7 mm, a
helix angle of preferably 30°, and a thread pitch of prefer-
ably 2 mm.

In the present disclosure, a surface pretreatment is con-
ducted on the semi-cylindrical pipe to obtain a pretreated
substrate.

In the present disclosure, the surface pretreatment is to
preferably conduct ultrasonic washing with acetone, ultra-
sonic washing with water, water rinsing, blow-drying, soak-
ing in an oxalic acid solution, and drying in sequence.

In the present invention, the ultrasonic washing with
acetone and the ultrasonic washing with water each are
conducted for preferably 10 min.

In the present disclosure, the blow-drying is conducted
preferably with high-purity nitrogen.

In the present disclosure, the oxalic acid solution has
amass fraction of preferably 20%, and the soaking in the
oxalic acid solution is to remove an oxide layer on a surface
of the internally-threaded pipe.

In the present disclosure, the drying is conducted at
preferably 80° C. for preferably 15 min.

In the present disclosure, magnetron sputtering is con-
ducted on a surface of the pretreated substrate to sequen-
tially obtain an alumina carrier layer, a noble metal-based
elementary substance layer, and a transition metal-transition
metal oxide layer, thereby obtaining the noble metal-transi-
tion metal-based nano-catalyst thin film.

In the present disclosure, the noble metal is preferably
selected from the group consisting of palladium and plati-
num; and the transition metal is preferably selected from the
group consisting of cobalt, titanium, copper, iron, and
nickel.

In the present disclosure, the magnetron sputtering has a
background vacuum degree of preferably less than $2 \times 10^{-6}$
Torr (1 Torr=133.322 Pa); preferably, the chamber is vacu-
umized with a mechanical pump and a molecular pump.

In the present disclosure, the magnetron sputtering is
conducted preferably using an ultra-high vacuum magnetron
sputtering system (PVD75).

In the present disclosure, when the alumina carrier layer
is formed by the magnetron sputtering, a sputtering method
is preferably direct current (DC) reactive magnetron sput-
tering, a sputtering gas is preferably high-purity helium
(99.99%), a reaction gas is preferably high-purity oxygen
(99.99%), and a sputtering target is a high-purity aluminum
target (2 inches, 99.99%).

In the present disclosure, pre-sputtering is conducted
preferably before the formation of the alumina carrier layer
by the magnetron sputtering, for preferably 15 min.

In the present disclosure, when the alumina carrier layer
is formed by the magnetron sputtering, argon and oxygen
have a flow ratio of preferably 2%, a sputtering power is
preferably 100 W, a sputtering time is preferably 60 min, a
substrate temperature is preferably at a room temperature,
and a sputtering pressure is preferably 3 mTorr.

In the present disclosure, when the magnetron sputtering
forms the noble metal-based elementary substance layer, the
sputtering gas is preferably high-purity helium, and the
sputtering power is preferably 50 W; a target material is
preferably a high-purity nano-noble metal powder, and the
high-purity nano-noble metal powder has a particle size of
preferably less than or equal to 100 nm.

In the present disclosure, when the transition metal-
transition metal oxide layer is formed by the magnetron
sputtering, a content of the target material is preferably
adjusted to coat the transition metal oxide-based thin film, the sputtering gas is preferably high-purity helium, the reaction gas is preferably high-purity oxygen, and the sputtering power is preferably 100 W; the sputtering target is preferably a high-purity nano-transition metal powder, and the high-purity nano-transition metal powder has a particle size of preferably less than or equal to 100 nm.

In the present disclosure, the preparation method preferably further includes splicing two of the semi-cylindrical pipes after magnetron sputtering into a cylindrical pipe after the transition metal-transition metal oxide layer is obtained.

In the present disclosure, preferably, the cylindrical pipe is embedded in a cylindrical regenerative chamber of a heating furnace, and then the catalytic gas combustion is conducted.

In the present disclosure, the cylindrical regenerative chamber has a length of preferably 20 mm and a pipe diameter of preferably 20 mm.

The preparation method further provides a noble metal-transition metal-based nano-catalyst thin film prepared by the preparation method, including the semi-cylindrical pipe, the alumina carrier layer, the noble metal-based elementary substance layer, and the transition metal-transition metal oxide layer.

In the present disclosure, the alumina carrier layer has a thickness of preferably 20 μm, and the noble metal-based elementary substance layer and the transition metal-transition metal oxide layer have a total thickness of preferably less than or equal to 100 μm.

In the present disclosure, when the transition metal is preferably cobalt, the transition metal-transition metal oxide layer preferably contains Co, $CoO_2$, and $Co_3O_4$.

In the present disclosure, the noble metal-transition metal-based nano-catalyst thin film is used in gas catalytic combustion. There is no special limitation on a specific manner of the use, and manners well known to those skilled in the art can be used.

In the present disclosure, the gas has a volume concentration of preferably less than 5%, more preferably less than 1%.

To further explain the present disclosure, the noble metal-transition metal-based nano-catalyst thin film and the preparation method and the use thereof provided in the present disclosure will be described in detail below in conjunction with examples which, however, should not be interpreted as limitations to the protection scope of the present disclosure.

Figure 3:
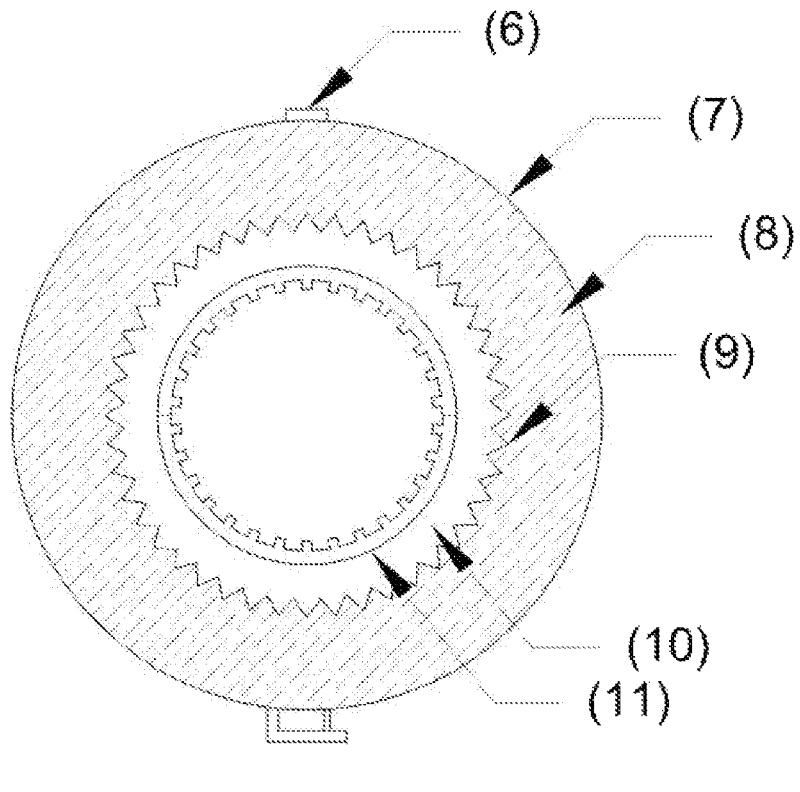
FIG. 3 shows a sectional view of a heating furnace; where
(1) is a thread rib width, (2) is a wall thickness, (3) is a
thread rib height, (4) is a helix angle, (5) is a thread pitch,
(6) is a connection device, (7) is a shell of a heating furnace,
(8) is a heat insulation material, (9) is a heating resistance
wire, (10) is an outer wall of a regenerative chamber, and
(11) is a cylindrical pipe with an inner thread structure.

FIG. 1 shows a front sectional view of a semi-cylindrical pipe with an inner thread structure; FIG. 2 shows a side sectional view of the semi-cylindrical pipe with an inner thread structure; and FIG. 3 shows a sectional view of a heating furnace; where (1) is a thread rib width, (2) is a wall thickness, (3) is a thread rib height, (4) is a helix angle, (5) is a thread pitch, (6) is a connection device, (7) is a shell of a heating furnace, (8) is a heat insulation material, (9) is a heating resistance wire, (10) is an outer wall of a regenerative chamber, and (11) is a cylindrical pipe with an inner thread structure.

Example 1

A preparation method of a palladium-cobalt nano-catalyst thin film included the following steps:

A semi-cylindrical pipe with an inner thread structure made of silicon carbide was prepared, with a length of 20 mm, an inner diameter of 20 mm, a number of threads of 30, a wall thickness of 1 mm, a thread rib width of 0.7 mm, a thread rib height of 0.7 mm, a helix angle of 30°, and a thread pitch of 2 mm.

The semi-cylindrical pipe with an inner thread structure was subjected to an ultrasonic treatment separately in acetone and deionized water in sequence for 10 min, rinsed with deionized water and blow-dried with high-purity nitrogen, and soaked in an oxalic acid solution (at a mass fraction: 20%) for 10 min to remove an oxide layer on a surface of the pipe with an internal thread, and a washed semi-cylindrical pipe with an inner thread structure was dried in a drying oven at 80° C. for 15 min.

By an ultra-high vacuum magnetron sputtering system (PVD75), an alumina thin film was loaded on a surface of the semi-cylindrical pipe with an inner thread structure through a sputtering method of DC reactive magnetron sputtering. A sputtering gas was high-purity helium (99.99%), a reaction gas was high-purity oxygen (99.99%), and a sputtering target was a high-purity aluminum target (2 inches, 99.99%). A carrier was a cleaned semi-cylindrical pipe with an inner thread structure. In order to remove oxides on a surface of the target, an aluminum target was pre-sputtered in pure helium for 15 min before coating. Before coating, the chamber was vacuumized using a mechanical pump and a molecular pump such that a background vacuum degree was less than $2 \times 10^{-6}$ Torr (1 Torr=133.322 Pa), and argon and oxygen had a flow ratio controlled by a mass flow controller to 2%, a sputtering power was 100 W, a sputtering time was 60 min, a substrate temperature was at a room temperature, a sputtering pressure was 3 mTorr, and a thickness was 20 μm.

An active component, palladium film, was plated on the semi-cylindrical pipe with an inner thread structure that had been coated with the alumina thin film by magnetron sputtering. The sputtering gas was high-purity helium, the target material was a high-purity nano-palladium powder (≤100 nm), and the sputtering power was 50 W. The content of the target material was adjusted to coat a cobalt oxide thin film. The sputtering gas was high-purity helium, the reaction gas was high-purity oxygen, and the sputtering target was a high-purity nano-cobalt powder (≤500 nm). During the sputtering, the vacuum degree was less than $2 \times 10^{-6}$ Torr, the sputtering power was 100 W; and a palladium elementary substance layer and a cobalt oxide layer had a total thickness of 100 μm.

Two of the semi-cylindrical pipes with an inner thread structure loaded with the palladium-cobalt nano-catalyst thin film were spliced into a cylindrical pipe, which was then embedded in a cylindrical regenerative chamber of a heating furnace. The regenerative chamber had a length of 20 mm and a pipe diameter of 20 mm.

During working, a starting temperature was set at 50° C., 100° C., 150° C., and 200° C. separately; extremely low-concentration gas with a methane volume concentration of 0.1% to 10% discharged during coal mine methane extraction was introduced into the heating furnace, and corresponding temperatures for 10%, 50%, and 90% of methane conversion were recorded as $T_{10}$, $T_{50}$, and $T_{90}$, respectively. A conversion efficiency of the treatment method was obtained through the conversion rates of methane at different reaction temperatures, and a catalytic activity of the catalyst was measured by the temperature and conversion rate.

The above described are merely preferred implementations of the present disclosure rather than limitations to the present disclosure in any form. It should be noted that those of ordinary skill in the art may further make several improvements and modifications without departing from the principle of the present disclosure, but such improvements and modifications should be deemed as falling within the protection scope of the present disclosure.

What is claimed is:

1. A preparation method of a noble metal-transition metal-based nano-catalyst thin film, comprising the following steps:

providing two semi-cylindrical pipes each with an inner thread structure and a semi-cylindrical shape; wherein each of the two semi-cylindrical pipes is prepared from silicon carbide; and each of the two semi-cylindrical pipes has a length of 20 mm, an inner diameter of 20 mm, a number of threads of 30, a wall thickness of 1 mm, a thread rib width of 0.7 mm, a thread rib height of 0.7 mm, a helix angle of 30°, and a thread pitch of 2 mm;

conducting a surface pretreatment on the inner thread structure of each of the two semi-cylindrical pipes to obtain two pretreated substrates; and conducting magnetron sputtering on a surface of the inner thread structure of each of the two pretreated substrates to sequentially obtain an alumina carrier layer, a layer containing a noble metal, and a layer containing a transition metal and an oxide of the transition metal, thereby obtaining the noble metal-transition metal-based nano-catalyst thin film on each of the two semi-cylindrical pipes.

2. The preparation method according to claim 1, wherein the surface pretreatment is to conduct ultrasonic washing with acetone, ultrasonic washing with water, water rinsing, blow-drying, soaking in an oxalic acid solution, and drying in sequence.

3. The preparation method according to claim 1, wherein the magnetron sputtering is conducted at a background vacuum degree of less than $2 \times 10^{-6}$ Torr.

4. The preparation method according to claim 1, wherein the method further comprises splicing the two semi-cylindrical pipes to form a cylindrical pipe.

5. The preparation method according to claim 1, wherein the noble metal in the layer containing the noble metal is selected from the group consisting of palladium and platinum; and the transition metal in the layer containing the transition metal and the oxide of the transition metal is selected from the group consisting of cobalt, titanium, copper, iron, and nickel.

6. A noble metal-transition metal-based nano-catalyst thin film prepared by the preparation method according to claim 1, comprising the two semi-cylindrical pipes, the alumina carrier layer, the layer containing the noble metal, and the layer containing the transition metal and the oxide of the transition metal;

wherein each of the two semi-cylindrical pipes is prepared from silicon carbide; and each of the two semi-cylindrical pipes has the length of 20 mm, the inner diameter of 20 mm, the number of threads of 30, the wall thickness of 1 mm, the thread rib width of 0.7 mm, the thread rib height of 0.7 mm, the helix angle of 30°, and the thread pitch of 2 mm.

7. The noble metal-transition metal-based nano-catalyst thin film according to claim 5, wherein the alumina carrier layer has a thickness of 20 μm, and the layer containing the noble metal and the layer containing the transition metal and the oxide of the transition metal have a total thickness of less than or equal to 100 μm.

* * * * *